(12) United States Patent
Ogata et al.

(10) Patent No.: US 10,256,999 B2
(45) Date of Patent: Apr. 9, 2019

(54) FREQUENCY CHARACTERISTIC ADJUSTING CIRCUIT, OPTICAL TRANSMITTER, AND OPTICAL TRANSCEIVER

(71) Applicant: FUJITSU LIMITED, Kawasaki-shi, Kanagawa (JP)

(72) Inventors: Yuuki Ogata, Kawasaki (JP); Toshihiko Mori, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/644,511

(22) Filed: Jul. 7, 2017

(65) Prior Publication Data

US 2018/0054331 A1  Feb. 22, 2018

(30) Foreign Application Priority Data

Aug. 19, 2016  (JP) .................................. 2016-161502

(51) Int. Cl.
| | | |
|---|---|---|
| H04B 10/40 | (2013.01) |
| H04L 25/03 | (2006.01) |
| H03G 5/02 | (2006.01) |
| H03G 9/24 | (2006.01) |
| H03G 3/30 | (2006.01) |
| H03G 5/24 | (2006.01) |
| H04B 10/588 | (2013.01) |

(52) U.S. Cl.
CPC ..... *H04L 25/03159* (2013.01); *H03G 3/3084* (2013.01); *H03G 5/025* (2013.01); *H03G 5/24* (2013.01); *H03G 9/24* (2013.01); *H04B 10/40* (2013.01); *H04B 10/588* (2013.01); *H04L 2025/03522* (2013.01)

(58) Field of Classification Search
CPC .......... H03G 5/025; H03G 9/24; H04B 10/40; H04B 10/502; H04L 25/03159
USPC .................................................. 327/101, 113
See application file for complete search history.

(56) References Cited

U.S. PATENT DOCUMENTS 5,930,022 A    7/1999  Okuma
9,419,410 B2*  8/2016  Usuki ..................... H01S 5/042
(Continued)

FOREIGN PATENT DOCUMENTS

| JP | H11-119175 | 4/1999 |
| JP | 2004-004317 | 1/2004 |
| JP | 2009-164386 | 7/2009 |

OTHER PUBLICATIONS

Usuki Tatsuya, "Robust Optical Data Transfer on Silicon Photonic Chip", Journal of Lightwave Technology, vol. 30, No. 18, pp. 2933-2940, Sep. 15, 2012 (8 pages).

*Primary Examiner* — William Hernandez
(74) *Attorney, Agent, or Firm* — Fujitsu Patent Center

(57) ABSTRACT

Disclosed is a frequency characteristic adjusting circuit disposed between an optical circuit element and a drive circuit driving the optical circuit element. The frequency characteristic adjusting circuit includes a capacitor, and two or more series circuits having a resistor and a switch, the two or more series circuits being connected in parallel with the capacitor, where resistance with respect to the switch that is turned on is changed according to an output voltage of the drive circuit by changing ON or OFF of the switch such that electric charge at a contact point between the optical circuit element and the capacitor is adjusted to be constant regardless of the output voltage of the drive circuit.

11 Claims, 14 Drawing Sheets

(56) References Cited

U.S. PATENT DOCUMENTS

| | | | |
|---|---|---|---|
| 2005/0243879 A1* | 11/2005 | Horiuchi | H01S 5/042 |
| | | | 372/38.07 |
| 2006/0067708 A1* | 3/2006 | Keil | G02F 1/0121 |
| | | | 398/183 |
| 2018/0054258 A1* | 2/2018 | Mori | H04B 10/548 |

* cited by examiner a: $\eta = 1$
b: $\eta = 0.5$
c: $\eta = 0.3$
d: $\eta = 0.2$
e: $\eta = 0.1$

TERM TO DETERMINE GAIN IN LOW FREQUENCY REGION

TERM TO DETERMINE BAND $$V_{MOD} = \frac{R_M}{R_L + R_S + R_M + R_F} \cdot \frac{1}{1 + \frac{j\omega C_M R_M (R_L + R_S)}{R_L + R_S + R_M + R_F}} \cdot V_{DD} \quad \cdots (3)$$

$$\eta = \frac{R_L + R_S + R_M}{R_L + R_S + R_M + R_F}$$

FREQUENCY CHARACTERISTIC ADJUSTING CIRCUIT, OPTICAL TRANSMITTER, AND OPTICAL TRANSCEIVER

CROSS-REFERENCE TO RELATED APPLICATION

This patent application is based upon, and claims the benefit of priority of Japanese Patent Application No. 2016-161502 filed on Aug. 19, 2016, the entire contents of which are incorporated herein by reference.

FIELD

The embodiments discussed herein relate to a frequency characteristic adjusting circuit, an optical transmitter using the frequency characteristic adjusting circuit, and an optical transceiver.

BACKGROUND

High-speed communications such as 40 Gbps (gigabit per second) and 100 Gbps per wavelength are being put to practical use in order to increase the capacity of optical communication networks along with the increase in data traffic. As a technology for achieving high-speed optical communications, a technology of fabricating a fine optical waveguide structure with silicon photonics technology to integrate an operation circuit and an electric/optical conversion circuit in one chip has attracted attention. In an optical modulator of silicon photonics, a voltage is applied to a PN junction formed in the center of the waveguide, and the optical path length is changed by utilizing a change in carrier density, that is, a change in refractive index (carrier plasma dispersion). Since the change in the refractive index is proportional to the change in the carrier density, it is desirable to change the carrier density with a smallest possible voltage change. In the PN junction, when a bias voltage is applied in a forward direction, the change in the carrier density is larger and the modulation efficiency is better. However, the bandwidth is narrow in such a configuration. In view of the driver, the junction capacitance of the optical modulator appears as load capacitance, the high frequency component signal attenuates and the band deteriorates. When a pin diode is used, the junction capacitance is larger, and the characteristics in the high frequency band become worse as a result.

In order to prevent degradation of a band in an optical modulator driven at high speed, a method of inserting a matching circuit formed by disposing a capacitor (C) and a resistor (R) between a driver circuit and an optical modulator has been proposed (e.g., see Non-Patent Document 1). In this method, the junction capacitance of the pin diode is reduced to the design capacity of the optical modulator by inserting a matching circuit electrically equivalent to the PN junction of the optical modulator.

RELATED ART DOCUMENT

Non-Patent Document

Non-Patent Document 1: T. Usuki, "Robust Optical Data Transfer on Silicon Photonic Chip", Journal of Lightwave Technology, vol. 30, No. 18, pp. 2933-2940, Sep. 15, 2012

SUMMARY

According to an aspect of an embodiment, a frequency characteristic adjusting circuit disposed between an optical circuit element and a drive circuit driving the optical circuit element includes a capacitor; and two or more series circuits having a resistor and a switch, the two or more series circuits being connected in parallel with the capacitor, where resistance with respect to the switch that is turned on is changed according to an output voltage of the drive circuit by changing ON or OFF of the switch such that electric charge at a contact point between the optical circuit element and the capacitor is adjusted to be constant regardless of the output voltage of the drive circuit.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

DESCRIPTION OF EMBODIMENTS

In related art technology, in adopting a configuration in which an equalizer circuit is inserted between an optical circuit element, such as an optical modulator and a surface emitting laser, and a drive circuit for driving the optical circuit element such that the band is extended on the high frequency side, the frequency characteristics of the optical circuit elements may vary due to process variation and nonlinear characteristics of the optical circuit elements. Such a case requires stabilizing the output of the optical circuit elements by appropriately adjusting parameter values of the equalizer circuit.

Hence, a frequency characteristic adjusting circuit capable of extending the operating band of an optical circuit element as well as stabilizing output characteristics may be required.

In the following embodiment, the frequency characteristic of the optical circuit elements may be stabilized by adjusting the parameter value of the equalizing circuit with lowest possible power consumption when expanding the operation band of the optical circuit elements by the equalizer circuit.

For example, when a current-voltage characteristic or a capacitance-voltage characteristic of the optical circuit element is linear; that is, when a change in current or capacitance does not change due to a change in voltage, the resistance value of the equalizer circuit is adjusted according to the process variability.

When the current-voltage characteristic or capacitance-voltage characteristic of the optical circuit element is non-linear; that is, when the change in current or capacity changes due to voltage change, the resistance value of the equalizer circuit is adjusted according to the level of the output voltage of the drive circuit even when there is no process fluctuation.

Prior to describing the specific configuration of the embodiment, fluctuation of the frequency characteristic according to the process variability and the nonlinearity of the characteristics of the optical circuit element will be described.

Figure 1A:
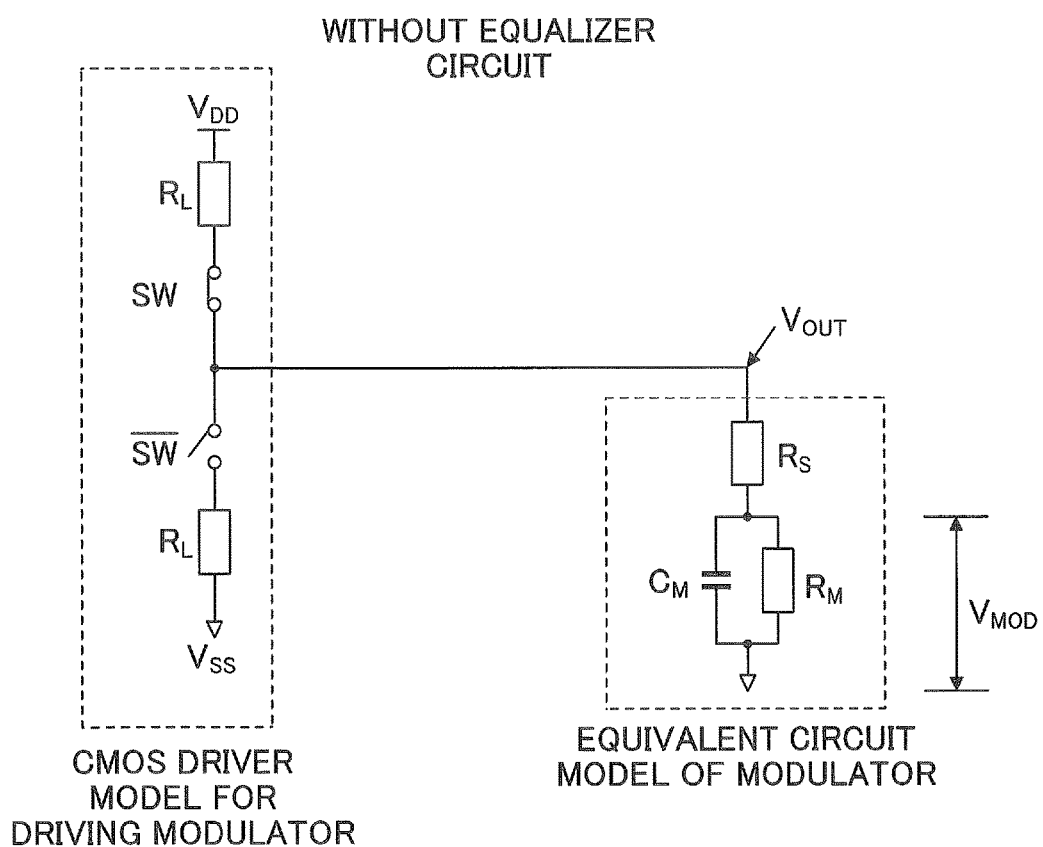
FIGS. 1A and 1B are diagrams illustrating extension of a high frequency band by inserting an equalizer circuit.
Figure 1B:
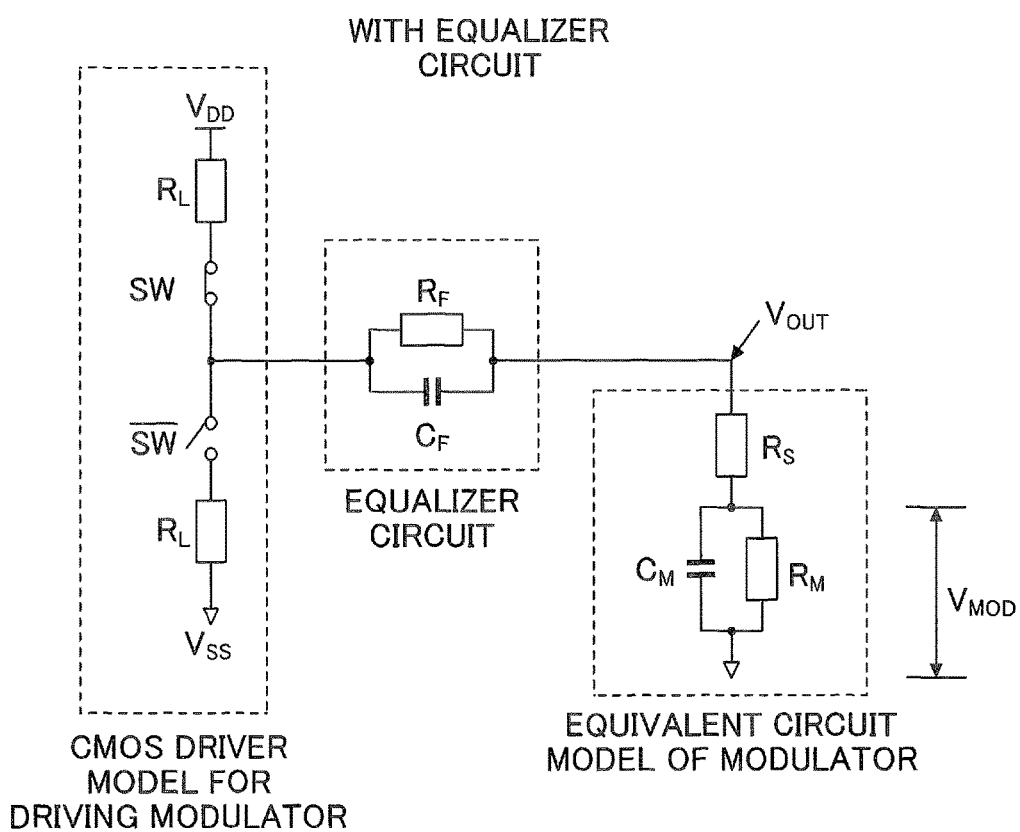
Figure 2:
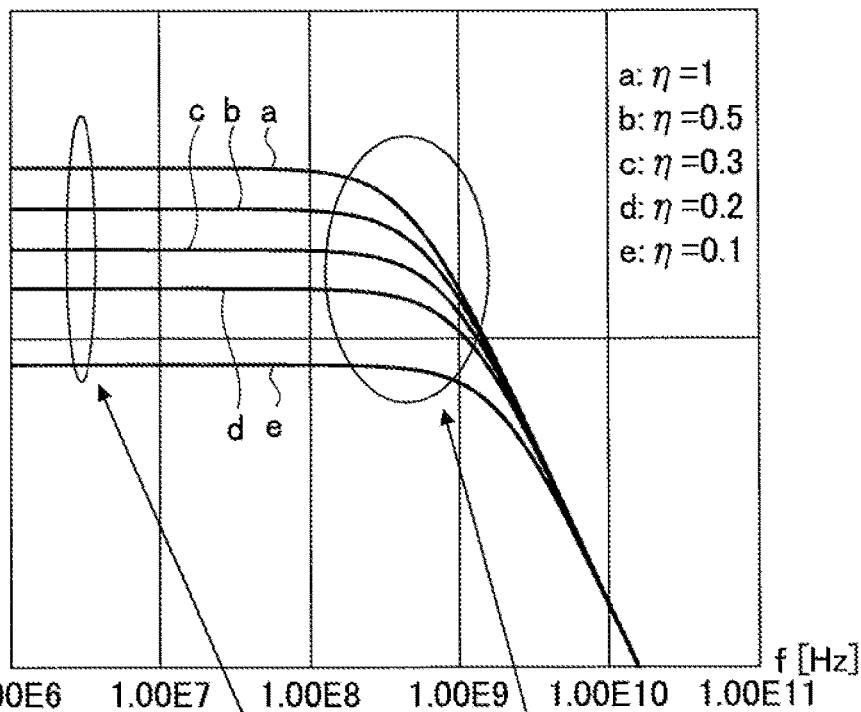
FIG. 2 is a diagram illustrating extension of a high frequency band by inserting an equalizer circuit.

FIGS. 1A, 1B and FIG. 2 are diagrams illustrating band extension using an equalizer circuit corresponding to a matching circuit of a known related art. FIG. 1A is an equivalent circuit diagram of a drive circuit and an optical modulator without an equalizer circuit, and FIG. 1B is an equivalent circuit diagram when an equalizer circuit is inserted.

Each MOS transistor of a CMOS driver for driving the optical modulator is represented by a switch (SW) and an internal resistance ($R_L$), and is connected in series between $V_{DD}$ and $V_{SS}$. The equalizer circuit is represented by a resistor $R_F$ and a capacitance $C_F$ connected in parallel. The optical modulator is represented by junction capacitance $C_M$ and junction resistance $R_M$ connected in parallel and parasitic resistance $R_s$ in series. $V_{MOD}$ is a voltage applied to a capacitance portion of the optical modulator.

In a case of FIG. 1A where no equalizer circuit is disposed, the voltage $V_{MOD}$ (to be accurate, the amount of electric charge at the voltage $V_{MOD}$) applied to the capacitance portion of the optical modulator is proportional to the amount of phase change, and the frequency dependence of the voltage $V_{MOD}$ represents the frequency dependence of the optical modulator. In the configuration of FIG. 1A, the frequency dependence of the voltage $V_{MOD}$ is expressed by the following equation (1).

$$V_{MOD} = \frac{R_M}{R_L + R_S + R_M} \cdot \frac{1}{1 + \frac{j\omega C_M R_M (R_L + R_S)}{R_L + R_S + R_M}} \cdot V_{DD} \quad (1)$$

When the equalizer circuit is inserted in the configuration of FIG. 1B, the resistance $R_F$ and the capacitance $C_F$ of the equalizer circuit are added, and a voltage condition is expressed by the following equation (2).

$$V_{MOD} = \frac{R_M}{(R_L + R_S + R_M) + j\omega C_M R_M (R_L + R_S) + \frac{1 + j\omega C_M R_M}{1 + j\omega C_F R_F} R_F} \cdot V_{DD} \quad (2)$$

When $C_M R_M = C_F R_F$ holds, equation (2) will be the following equation (3), which has the same form as the equation (1).

$$V_{MOD} = \frac{R_M}{R_L + R_S + R_M + R_F} \cdot \frac{1}{1 + \frac{j\omega C_M R_M (R_L + R_S)}{R_L + R_S + R_M + R_F}} \cdot V_{DD} \quad (3)$$

The equation (3) indicates that the amount of change at the node of $V_{out}$, that is, (the amount of change of $C_M$-the amount of change of $C_F$) does not depend on the value of $V_{DD}$.

FIG. 2 is a graph illustrating a relationship between the frequency characteristic and the resistance $R_F$ of the equalizer circuit. The horizontal axis of the graph indicates the frequency [Hz], and the vertical axis of the graph indicates the gain or the voltage applied to the optical modulator. The parameter η is determined as η=(RL+RS+RM)/(RL+RS+RM+RF), and a configuration having no equalizer circuit (RF=0, η=1) is compared with a configuration where an equalizer circuit is inserted (η<1). $R_M/(R_L+R_S+R_M+R_F)$, which is the first term multiplied in the right side of the equation (3), is a term for determining the gain of the low frequency region and $C_M R_M (R_L+R_S)/(R_L+R_S+R_M R_F)$ is a term for determining the band.

The graph of FIG. 2 indicates that inserting an equalizer circuit lowers the gain in the medium frequency region according to the value of "η" while maintaining the flat characteristic; however, the band is expanded by a factor of 1/η. The graph further indicates that when $C_M R_M = C_F R_F$, the gain and the band may be controlled in the low frequency region only by adjusting the $R_F$.

The description of FIGS. 1A and 1B, and FIG. 2 is not limited to the case where an optical modulator is subject to being driven, and is also applied to a case where a direct modulation laser diode such as a VCSEL (Vertical Cavity Surface Emitting Laser) is subject to being driven.

Figure 3A:
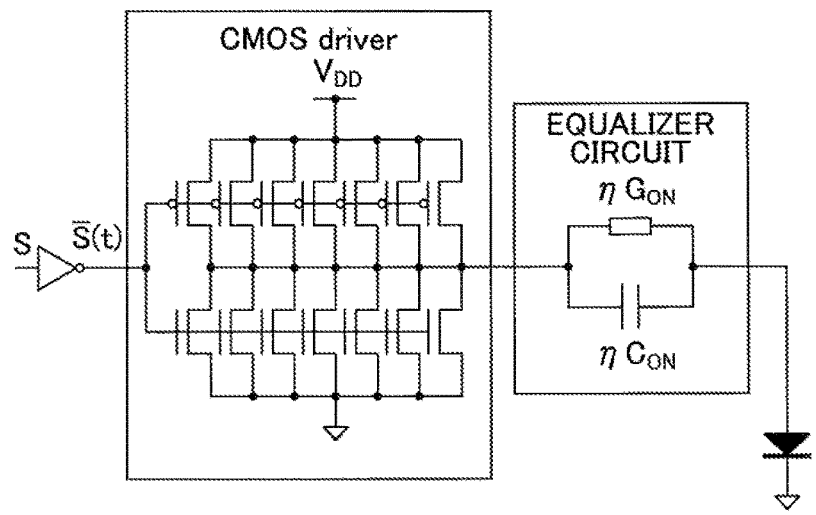
FIGS. 3A, 3B and 3C are diagrams illustrating examples when a known art configuration is applied.
Figure 3B:
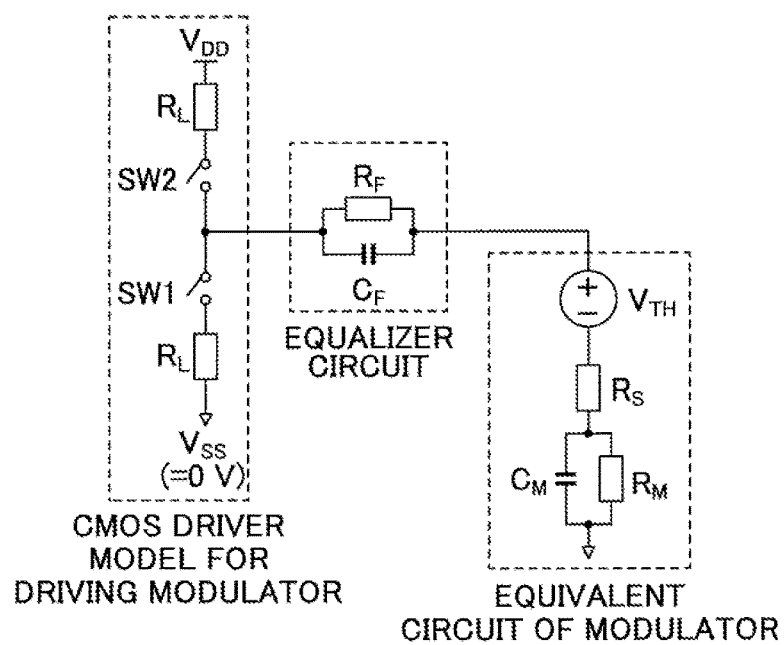
Figure 3C:
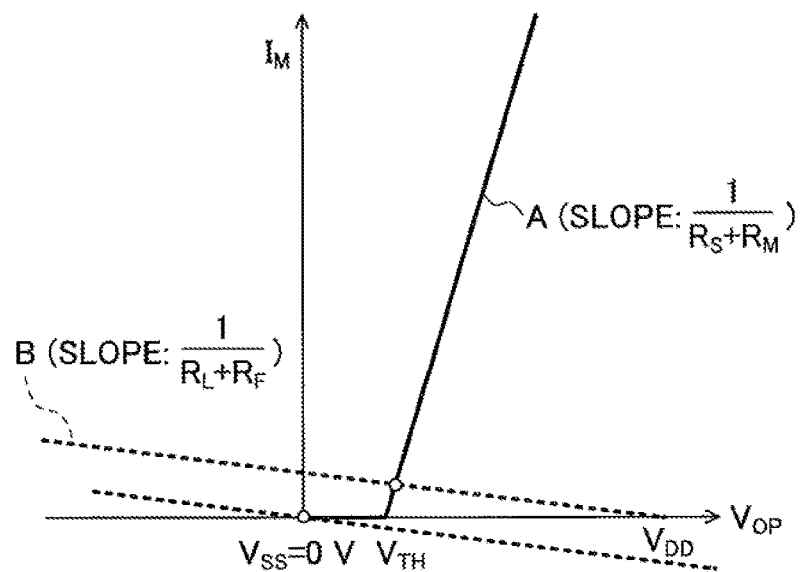

FIGS. 3A, 3B and 3C are diagrams illustrating a problem when the equalizer circuit is used. FIG. 3A illustrates a diagram in which the drive circuit is formed of a CMOS driver, and an equalizer circuit is inserted between the CMOS driver and the diode. Suppose that $\eta C_{ON}$ represents conductance of the capacitance of the equalizer circuit and $\eta G_{ON}$ represents conductance of the resistor. In view of the driver, the total capacitance is $\eta C_{ON}/(1+\eta)$. When η is determined to be sufficiently smaller than 1, the capacitance becomes small, and the frequency dependence becomes small even at high speed operation. FIG. 2 also indicates such an outcome.

FIG. 3B is an equalizing circuit model corresponding to FIG. 3A. The transistor of the CMOS driver is simplified by a switch SW and an internal resistance $R_L$. In the graph of FIG. 3C, the horizontal axis represents the operating voltage $V_{OP}$ and the vertical axis represents the current $I_M$ flowing through the optical modulator. A solid line A indicates a current-voltage characteristic of the optical modulator, and a broken line B indicates a load line. For example, in order for the modulator to output a "1" state when the driver outputs a high-potential (H) voltage, it is necessary to provide an appropriate $R_L$ or power supply voltage $V_{DD}$. Suppose the threshold voltage $V_{TH}$ is 0.6 V, the intersection of the current-voltage characteristic and the load line is 0.9 V (overdrive voltage is 0.3 V), and η=0.1 (10-fold bandwidth expansion). In this case, even when $R_L$ is infinite and $R_S$ is approximated to 0, $V_{DD}$ results in 3.6 V. Even when a driver circuit is manufactured with CMOS capable of achieving such a voltage, the driver circuit will not operate at a high speed of 10 Gbps or more.

As one solution, use of additional power supply voltages $V_{DDP}$ and $V_{DDN}$ for bias application to the optical modulator may be considered to lower the power supply voltage $V_{DD}$ of the driver to a low voltage of 1.0V or less, as illustrated in FIGS. 4A to 4C and FIGS. 5A to 5C.

Figure 4A:
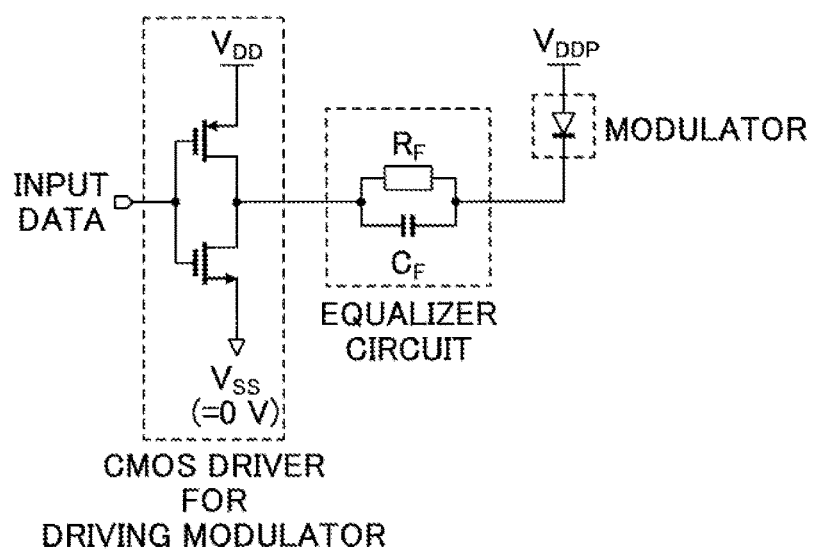
FIGS. 4A, 4B and 4C are diagrams illustrating examples when the related art configuration is applied.
Figure 4B:
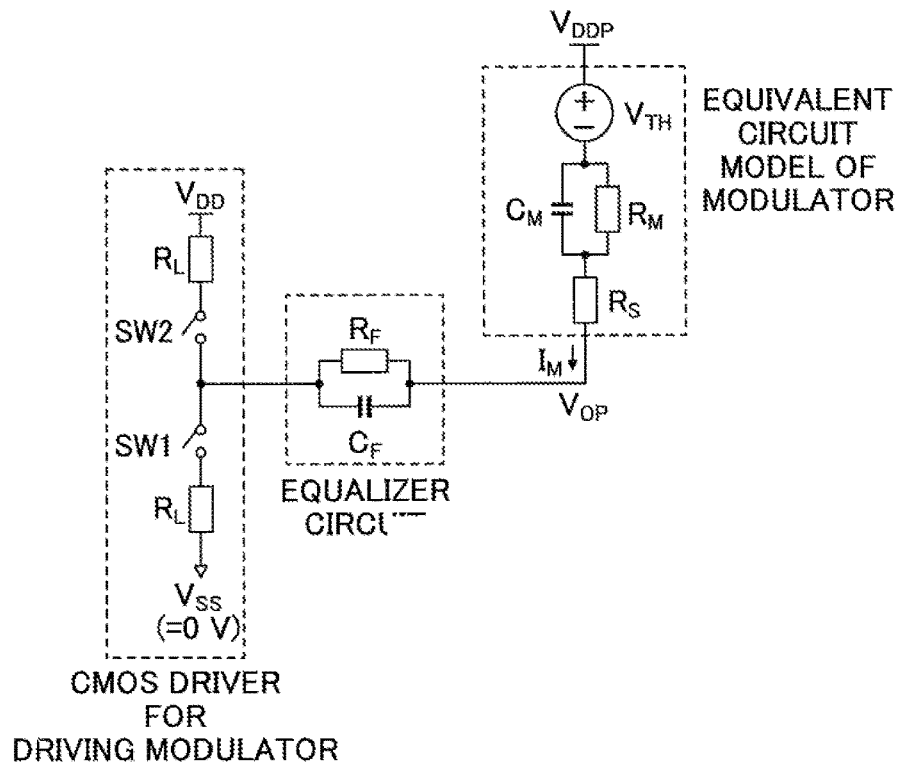
Figure 4C:
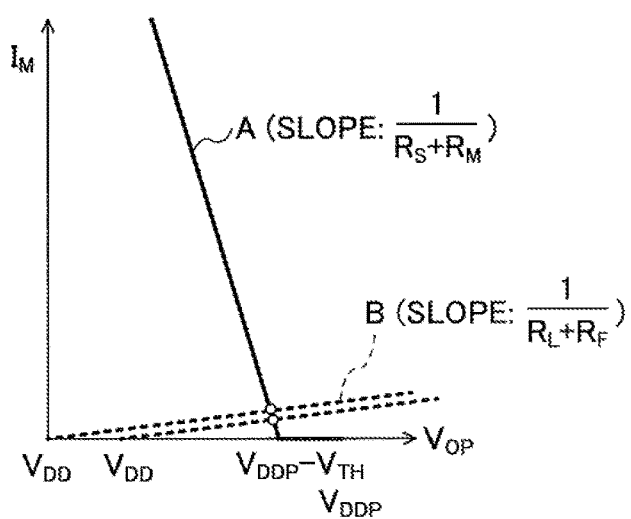
Figure 5A:
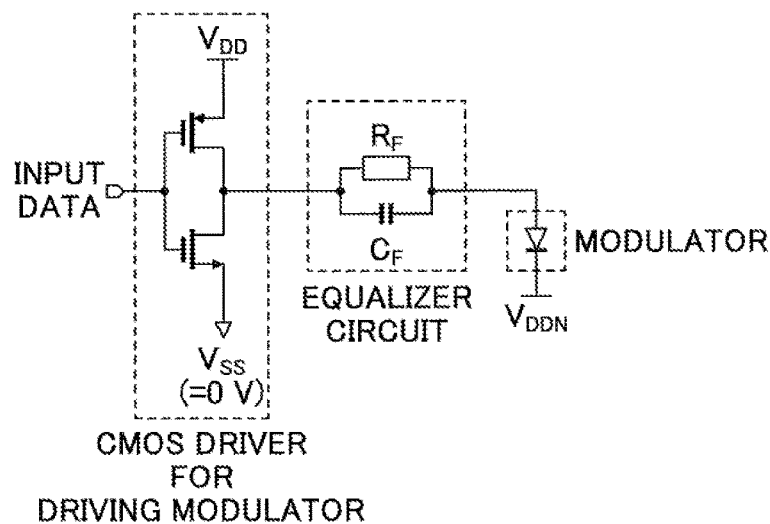
FIGS. 5A, 5B and 5C are diagrams illustrating examples when a related art configuration is applied.
Figure 5B:
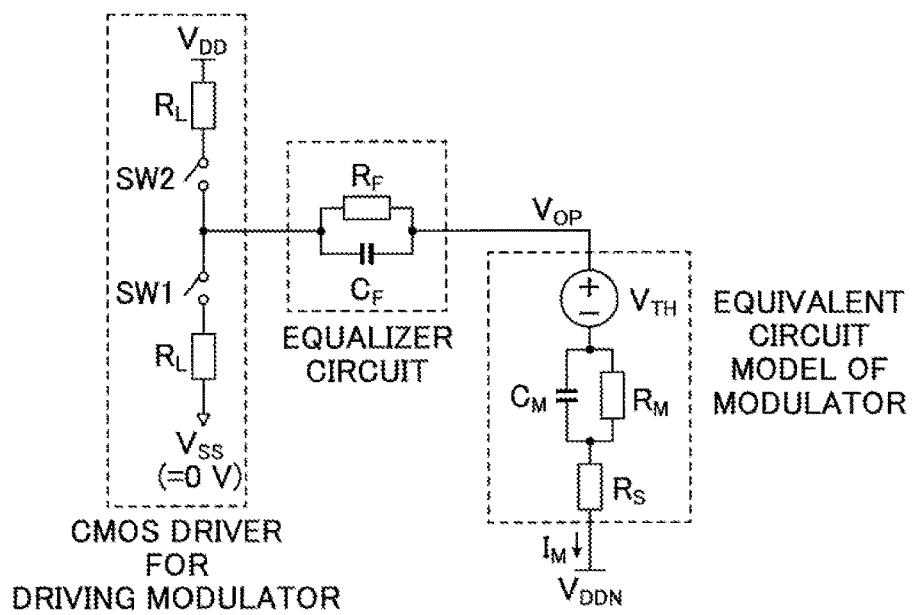
Figure 5C:
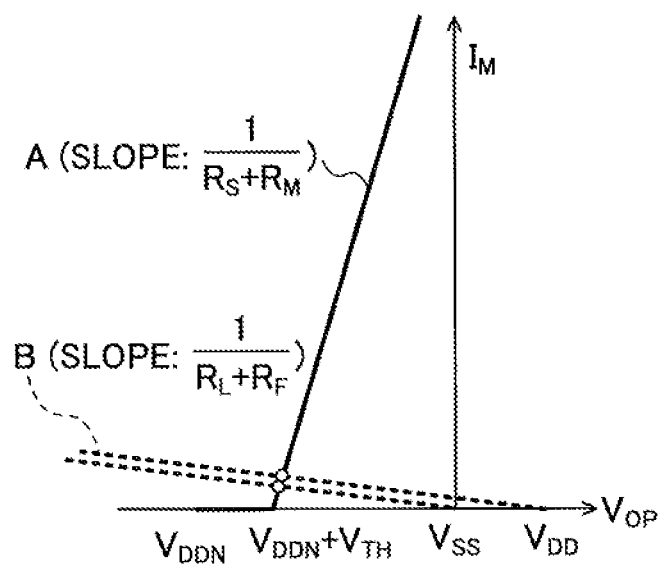

FIGS. 4A to 4C illustrate configuration examples in which a positive DC bias ($V_{DDP}$) higher than $V_{DD}$ is applied to the optical modulator. FIGS. 5A to 5C illustrate configuration examples in which a bias ($V_{DDN}$) lower than the ground potential of the CMOS driver is applied to the optical modulator. When $V_{DD}$=0.9 V and $V_{SS}$=0 V in FIGS. 4A to 4C and FIGS. 5A to 5C, a high voltage such as $V_{DDP}$=3.6 V (FIGS. 4A to 4C) or a negative voltage such as $V_{DDN}$=−2.7 V (FIGS. 5A to 5C) will be required. A general voltage supplied to the optical module is 3.3 V, and the circuit will be complicated and large in size in order to generate a high voltage or a negative voltage from this supply voltage.

Further, the equalizer circuit is disposed on the basis that $C_M R_M = C_F R_F$ holds; however, $C_M R_M = C_F R_F$ may fail to hold due to process variability. Further, the junction capacitance $C_M$ and the junction resistance $R_M$ of the optical circuit element (optical modulator, laser diode, etc.) are nonlinear with respect to the voltage, and $C_M R_M = C_F R_F$ does not necessarily hold due to the change in the driver output that is switched according to the input data "1" and "0".

Figure 6:
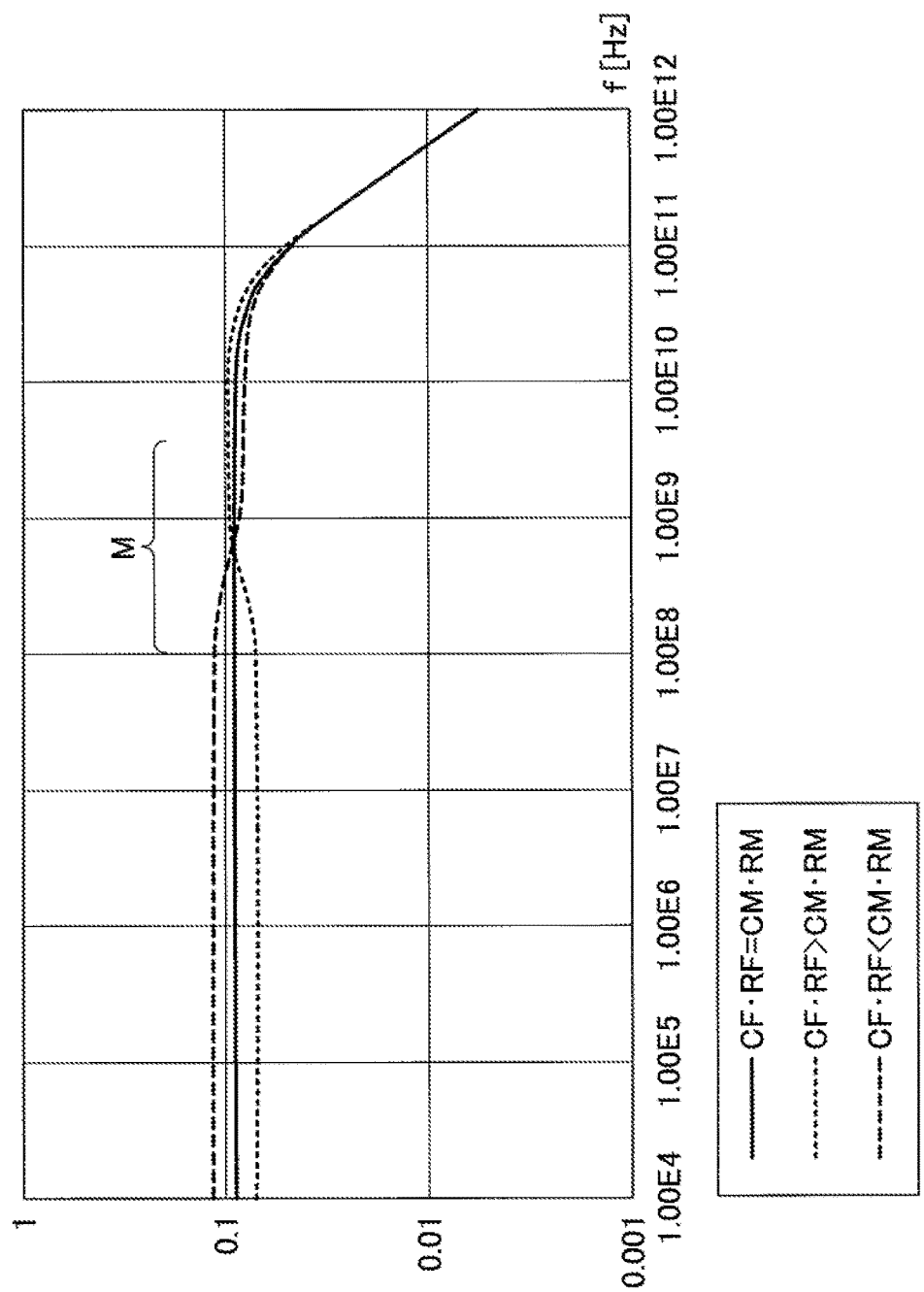
FIG. 6 is a diagram illustrating fluctuation in frequency characteristics occurring when a related art configuration is applied.

FIG. 6 is a diagram illustrating the fluctuation in the frequency characteristic when the equalizer circuit having a related art configuration is applied. The horizontal axis represents frequency, and the vertical axis represents gain according to a log scale (the voltage applied to the optical circuit element). In this configuration, the band is expanded toward the high frequency by inserting an equalizer circuit and setting η=0.1.

The solid line in FIG. 6 indicates the characteristic obtained on the basis that $C_M R_M = C_F R_F$ holds in the equation (2), that is, a small signal characteristic represented by the equation (3). This indicates that even when the band is expanded, the flat characteristic is maintained. However, $C_M R_M = C_F R_F$ does not necessarily hold when $C_F$, $R_F$, $C_M$, and $R_M$ deviate from design values due to process variability or nonlinear elements that are resistant to voltage dependence of junction capacitance and junction resistance are included.

Hence, the graph in FIG. 6 illustrates the frequency characteristic (short broken line) under the condition of $C_F R_F > C_M R_M$ simultaneously with the frequency characteristic (long broken line) under the condition of $C_F R_F < C_M R_M$. When the condition of $C_F R_F = C_M R_M$ is not satisfied, the frequency characteristic is not flat in the medium frequency region M of 100 MHz to several GHz.

One of the reasons that the frequency characteristic fluctuates in the medium frequency region is that when the output level ("H" or "L") of the CMOS driver changes in accordance with the input data in FIG. 1B, the amount of electric charge in the node $V_{out}$ changes and the gain changes in accordance with whether the change in the signal is quicker or slower than the time constant (to $C_M R_M$) of the change in the amount of electric charge in the node $V_{out}$.

Accordingly, when there is strong nonlinearity in the current-voltage characteristic or capacitance-voltage characteristic of the optical modulator, and the condition of $C_F R_F = C_M R_M$ holds at a certain input, the condition of $C_F R_F = C_M R_M$ will not hold for another input, causing characteristic fluctuation to occur in the medium frequency band as illustrated in FIG. 6. Specifically, in the forward PN junction, the change in the junction capacitance with respect to the voltage is nonlinear, and the frequency characteristic tends to fluctuate.

When the characteristic fluctuates in the medium frequency region M, inter-symbol interference (ISI), which is jitter of data dependence, occurs. Hence, when the nonlinearity is strong, it is desirable to stabilize the frequency characteristic by setting the resistance value of the equalizer circuit to an appropriate value according to the output level of the driver.

Figure 7A:
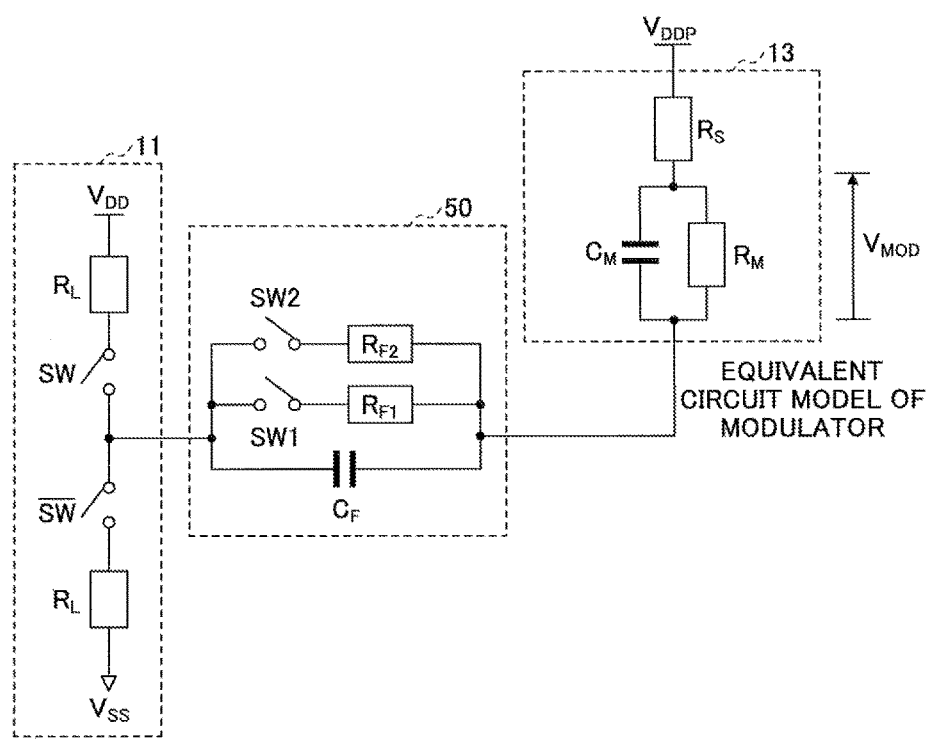
FIGS. 7A and 7B are diagrams illustrating the basic concept of an embodiment.
Figure 7B:
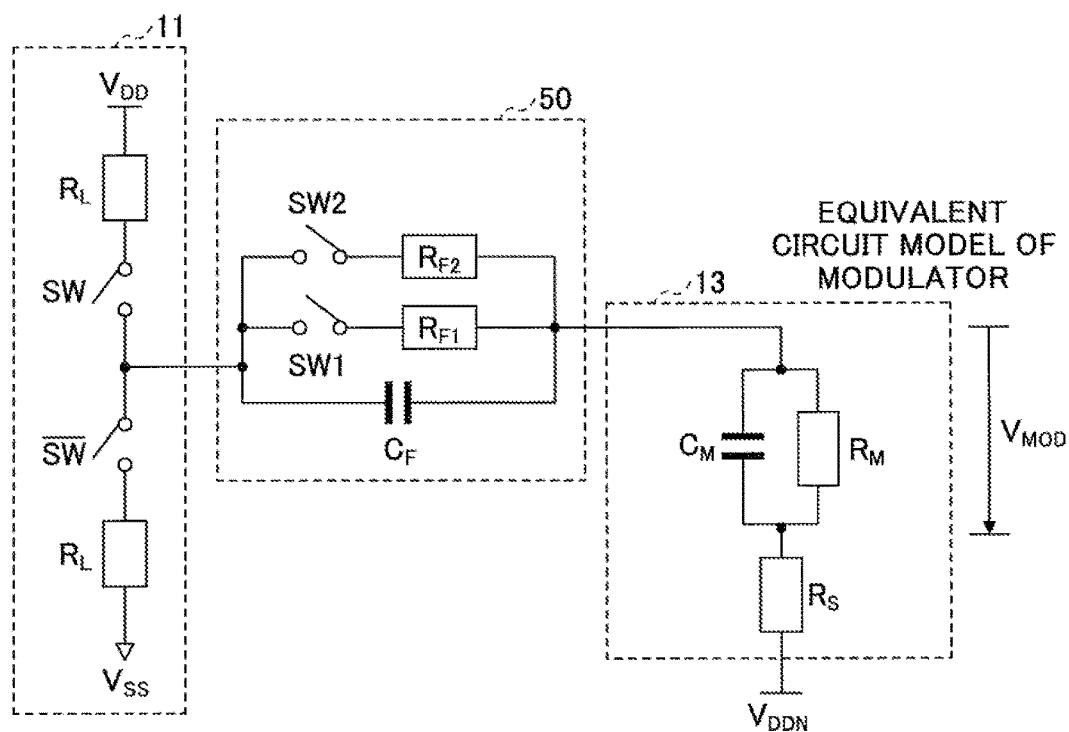

FIGS. 7A and 7B are diagrams illustrating the basic concept of an embodiment. An equalizer circuit 50 capable of selecting a resistor is inserted between a drive circuit 11 and an optical circuit element 13. The drive circuit 11 is, similar to FIGS. 1A and 1B, schematically represented by complementary switches (SW and SW bar) and internal resistance ($R_L$). The optical circuit element 13 is illustrated as an equivalent circuit model of the optical modulator. In FIG. 7A, a DC bias ($V_{DDP}$), which is a positive reference potential, is applied to the optical circuit element 13. In FIG. 7B, a DC bias ($V_{DDN}$), which is a negative reference potential (e.g., ground potential), is applied to the optical circuit element 13.

The equalizer circuit 50 has a capacitor $C_F$ connected to the output of the drive circuit 11 and two or more resistors $R_{F2}$ and $R_{F2}$ connected in parallel with the capacitor $C_F$. In FIGS. 7A and 7B, the switch SW1 is inserted in series with the resistor $R_{F1}$, and the switch SW2 is inserted in series with the resistor $R_{F2}$; note that more than two or such sets may be used. On/off control of the switches SW1, SW2, or more SWs is controlled, and one of the resistors is selected such that the condition of $C_F R_F = C_M R_M$ is satisfied.

Figure 8:
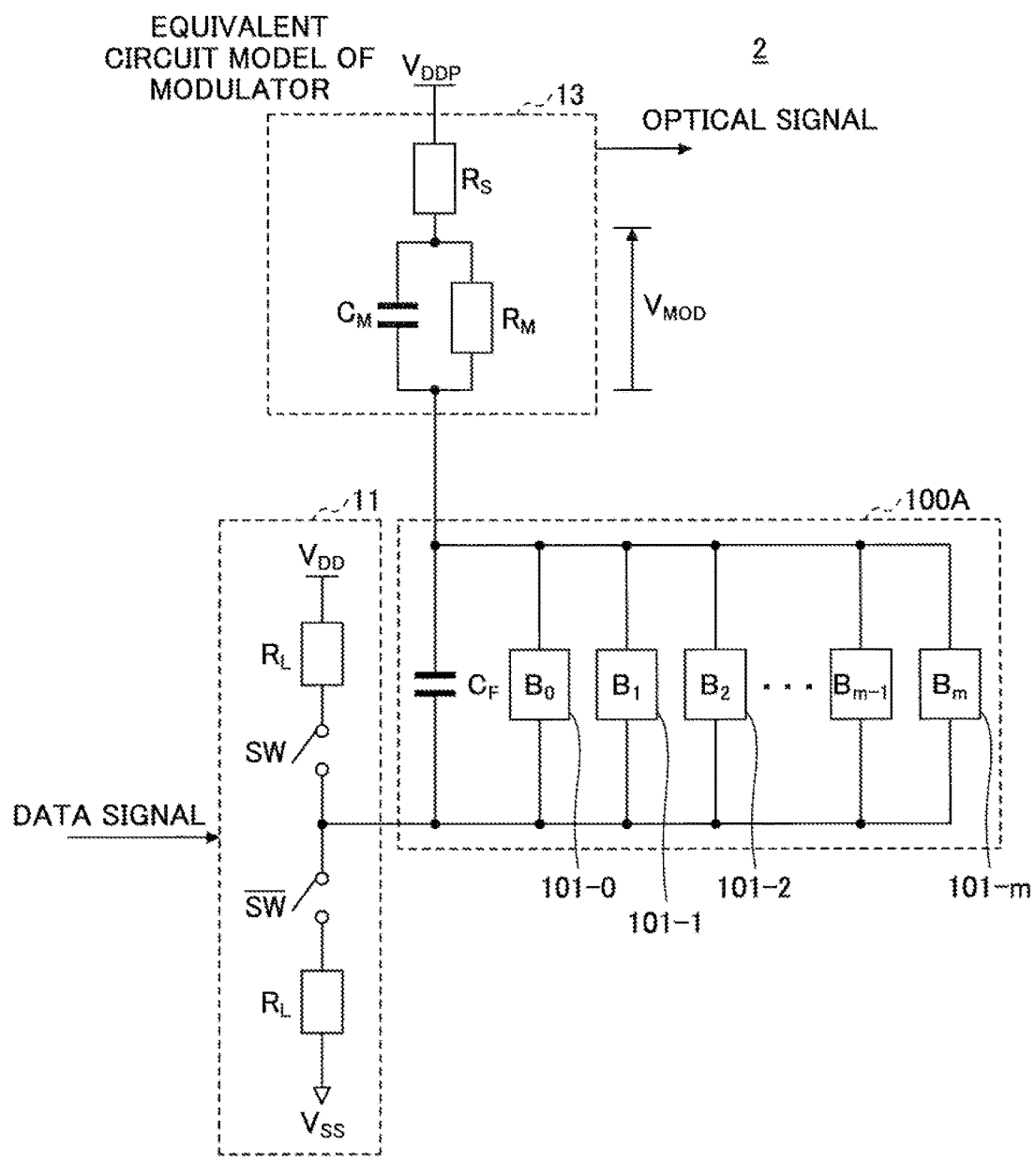
FIG. 8 is a schematic diagram of an optical transmitter 2 using a frequency characteristic adjusting circuit 100A according to an embodiment.
Figure 9:
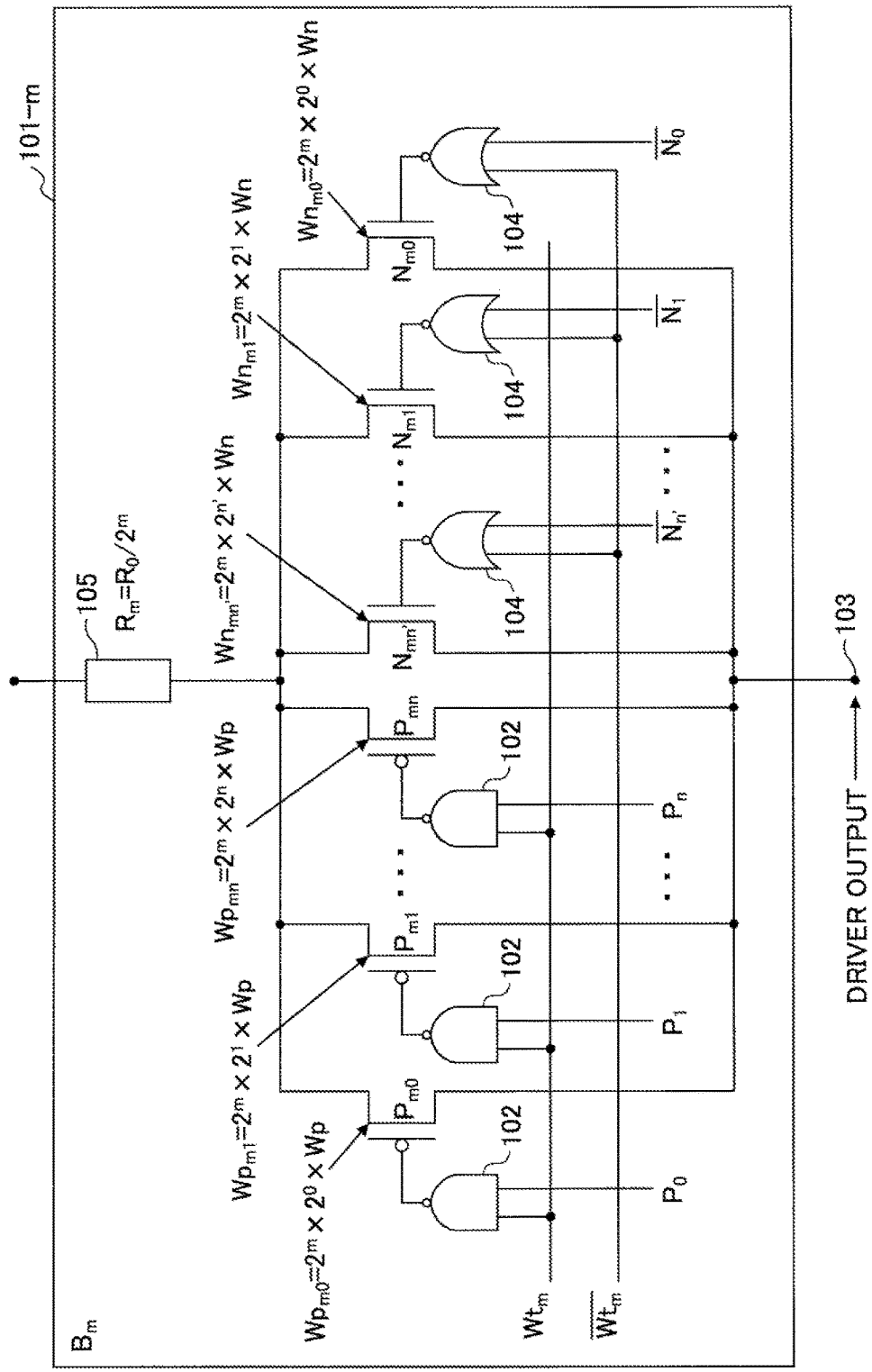
FIG. 9 is a configuration diagram of a resistor block used in the frequency characteristic adjusting circuit 100A of FIG. 8.

FIG. 8 is a schematic diagram of an optical transmitter 2 using a frequency characteristic adjusting circuit 100A according to the embodiment, and FIG. 9 is a diagram illustrating a configuration example of the resistor block $B_m$ used in the frequency characteristic adjusting circuit 100A of FIG. 8. In FIG. 8, an optical transmitter 2 includes a drive circuit 11 to which a data signal (electric signal) is input, an optical circuit element 13 driven by the drive circuit 11, and a frequency characteristic adjustment circuit 100A arranged between the drive circuit 11 and the optical circuit element 13.

The frequency characteristic adjustment circuit 100A has a capacitor $C_F$ and multiple resistance blocks $B_0$ to $B_m$ (101-0 to 101-m) connected in parallel with the capacitor $C_F$. Each of the resistor blocks 101 includes a PMOS transistor and an NMOS transistor connected in series with the resistor R. A specific configuration of the resistor block 101 will be described later with reference to FIG. 9.

Assuming that resistance block $B_0$ is a reference reference block and its resistance value is $R_0$, the resistance value $R_1$ of the resistor block B1 is set to ½ of the reference resistance value $R_0$, the resistance value $R_2$ of the resistor block B2 is set to ¼ of the reference resistance value $R_0$, the resistance value $R_3$ of the resistor block B3 is set to ⅛ of the reference resistance value $R_0$, and the resistance value $R_m$ of the resistance block $B_m$ is set to $\frac{1}{2^m}$ of the reference resistance value $R_0$.

In order to set the resistance value $R_1$ to $\frac{1}{2}$ of the reference resistance value $R_0$, the width and the gate width of the resistor element may be doubled, for example. In order to set the resistance value $R_2$ equal to $\frac{1}{4}$ of the reference resistance value $R_0$, the width and gate width of the resistor element may be quadrupled.

The amount of electric charge applied to an input terminal of the optical circuit element 13 is kept constant irrespective of the change of the input data between "0" and "1", by selecting the on or off state of the transistor in the block 101. In a case where the voltage applied to the capacitance portion of the optical circuit element 13 is $V_{M1}$ when the output of the drive circuit 11 is $V_{SS}$, the current flowing to the optical circuit element 13 based on the voltage applied is $I_{M1}$ ($V_{M1}$), and the charge stored in the capacitance portion (PN junction or depletion layer) of the optical circuit element 13 is $Q_{M1}$; and in a case where the voltage applied to the capacitance portion of the optical circuit element 13 is $V_{M2}$ when the output of the drive circuit 11 is $V_{DD}$, the current flowing through the optical circuit element 13 based on the voltage applied is $I_{M2}$ ($V_{M2}$), and the charge stored in the capacitance portion (PN junction or depletion layer) of the optical circuit element 13 is $Q_{M2}$, the amount of electric charge at the input terminal of the optical circuit element 13 is set to be constant. That is, the amount of electric charge at the input terminal of the optical circuit element 13 is set to "$Q_{M1} - C_F(V_{DDN} - V_{M1} - V_{SS}) = Q_{M2} - C_F(V_{DDP} - V_{M2} - V_{DD})$". As a result, the amount of electric charge applied to the input terminal of the optical circuit element 13 is kept constant irrespective of the change of the input data between "0" and "1". Hence, the frequency characteristic becomes flat in the band-extended optical circuit element 13, and a stable high-speed operation may be achieved.

FIG. 9 illustrates a configuration example of the resistance block $B_m$ (101-$m$). A driver output that is the output of the drive circuit 11 is connected to a node 103. The resistor block 101-$m$ has a resistor element 105 having a resistance value $R_m$ ($R_m = R_0/2^m$) and a transistor group connected in series with the resistor element 105. The transistor group includes n PMOS ($P_{m0}$ to $P_{mn}$) transistors and n' NMOS ($N_{m0}$ to $N_{mn'}$) transistors connected in parallel. Each of the multiple PMOS transistors has a different size, and the gate width of the PMOS transistor is weighted by $2^i$ (i is an integer from 0 to n). Similarly, each of the multiple NMOS transistors has a different size, and the gate width of the PMOS transistor is weighted by $2^j$ (j is an integer from 0 to n').

A gate of each PMOS transistor is connected to a NAND circuit 102. One input of the NAND circuit 102 is connected to a word line $Wt_m$, and the other input of the NAND circuit 102 is connected to one of the selection signals $P_0$ to $P_n$.

A gate of each NMOS transistor is connected to a NOR circuit 104. One input of the NOR circuit 104 is connected to an inverted word line $W_{tm}$ (bar), and the other input is connected to one of inverted selection signals $N_0$ (bar) to $N_{n'}$ (bar). Word lines $W_{tm}$ and $W_{tm}$ (bar) are signal lines for selecting blocks $B_0$ to $B_m$. When the block 101-$m$ is selected in FIG. 9, a high potential signal is input to the word line $W_{tm}$ connected to the block 101-$m$ from an external control circuit, and a low potential signal is input from the external control circuit to the word line $W_{tm}$ (bar). The external control circuit will be described later with reference to FIG. 10. The selection of one of the selection signals $P_0$ to $P_n$ or one of the selection signals $N_0$ (bar) to $N_{n'}$ (bar) to be used (i.e., which transistor to be turned on) is also controlled by the external control circuit. For example, in order to turn on the PMOS transistors $P_{m0}$ and $P_{m1}$, the selection signals $P_0$ and $P_1$ are at a high potential, and the other selection signals for PMOS transistors are at a low potential. In order to turn on the NMOS transistors $N_{m0}$ and $N_{m1}$, the selection signals $N_0$ and $N_1$ are at a low potential and the other selection signals for NMOS are at a high potential.

When an anode of the optical circuit element 13 of FIG. 8 is connected to a power supply $V_{DDP}$ (first power supply) and the drive circuit 11 is connected to $V_{DD}$ (second power supply) (see FIGS. 7A and 7B), a resistor element 105 is disposed on a cathode side of the optical circuit element 13, and a transistor group serving as switches is arranged on the output side of the drive circuit 11.

When a cathode of the optical circuit element 13 of FIG. 8 is connected to the power supply $V_{DDN}$ and the drive circuit 11 is connected to $V_{SS}$, the resistor element 105 is disposed on an anode side of the optical circuit element 13, and a transistor group serving as a switch is arranged on the output side of the drive circuit 11.

When the switch (the transistor group) is selected as described above, the circuit of FIG. 9 is logically configured such that the gates of the PMOS transistors (i.e., the output of the NAND circuit 102) are biased to ground or low potential, and the gates of the NMOS transistors (i.e., the output of the NOR circuit 104) are biased to ground or a high potential.

The high potential supplied to the gates of the NMOS transistors and the $V_{DD}$ of the drive circuit may be the same.

When the potential of the word line $W_{tm}$ is high potential (H) and the potential of the selection signal $P_i$ is high potential (H), the PMOS connected to the selection signal $P_i$ turns on. When the potential of the inverted word line $W_{tm}$ (bar) is low potential (L) and the potential of the inverted selection signal $N_j$ is low potential (L), the NMOS connected to the inverted selection signal $N_j$ turns on.

Accordingly, when the word line $W_{tm}$ is H and $P_i$ and $N_j$ are H, the PMOS transistor $P_{mi}$ and the NMOS transistor $N_{mj}$ turn on. When the driver output is high, the PMOS transistors predominantly turn on, and when the driver output is low, the NMOS transistors predominantly turn on. Hence, the resistance ratio may be changed according to the difference of the driver output. In other words, the combined resistance value of the on-resistance of the PMOS transistors and the NMOS transistors and the resistor element Rm is changed in accordance with the output voltage of the drive circuit 11 by controlling the number of ON states or OFF states of the PMOS transistors and the number of ON states or OFF states of the NMOS transistors.

When the withstand voltage of the PMOS transistors and the NMOS transistors is not sufficiently high with respect to $V_{DDP}$-GND or $V_{DD}$-$V_{DDN}$, it is desirable to set some of the transistors to be constantly on. This is because, when all the transistors are turned off, no current flows through the modulator, thus it is necessary to prevent the application of a voltage higher than the withstand voltage between the nodes of the switch.

It is possible to control the selection of a resistor block by connecting multiple resistor blocks $B_m$ of FIG. 9 in parallel as illustrated in FIG. 8 and switching the potential applied to the word line $W_{tm}$ between H and L. As a result, it is possible to set a desired resistance value or a value close to the desired value, which keeps the amount of electric charge applied to the input terminal of the optical circuit element 13 constant, regardless of the DC resistance ratio or the change of the input data between "0" and "1".

Figure 10:
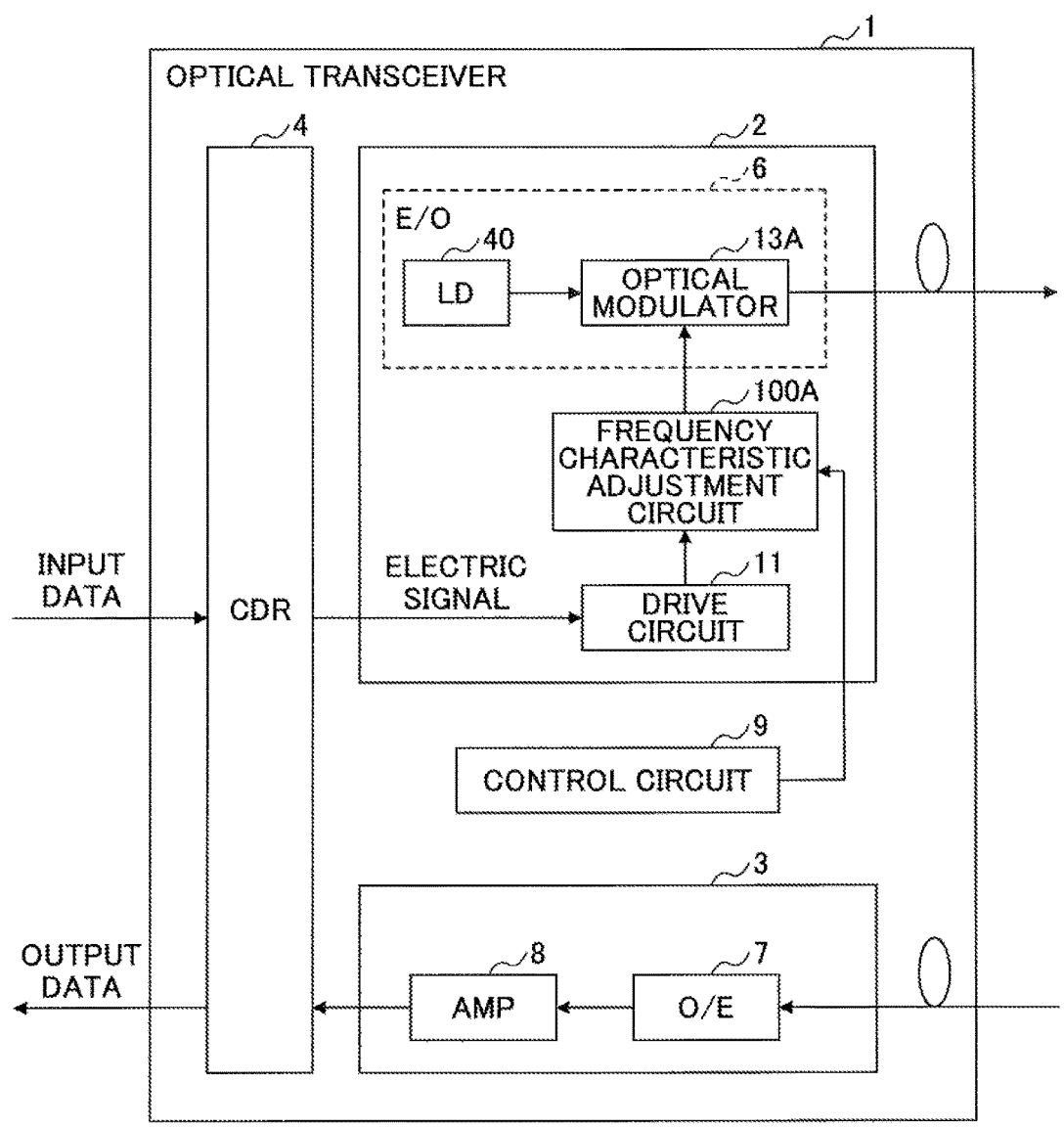
FIG. 10 is a schematic diagram of an optical transceiver to which the frequency characteristic adjusting circuit 100A according to the embodiment is applied.

FIG. 10 is a schematic diagram of the optical transmitter 2 to which the frequency characteristic adjustment circuit 100A of the embodiment is applied and the optical transceiver 1 using the optical transmitter 2.

The optical transceiver 1 has the optical transmitter 2, an optical receiver 3, a clock data recovery (CDR) 4, and a control circuit 9. The optical transmitter 2 includes a drive circuit 11, a frequency characteristic adjustment circuit 100A, an optical modulator 13A as an optical circuit element, and an LD 40 as a light source. The optical modulator 13A and the LD 40 form an electric/optical (E/O) converter 6.

The optical receiver 3 includes an optical/electric (O/E) converter 7 having a light receiving element such as a photodiode (PD) and an amplifier 8. The amplifier (AMP) 8 includes, for example, a transimpedance amplifier (TIA) configured to convert a current output from the PD into a voltage, and a linear amplifier configured to amplify the output of the TIA to a voltage level suitable for the CDR.

A data signal input from an external signal processor such as a CPU is waveform-shaped by the CDR 4 and input into the drive circuit 11. The drive circuit 11 is configured to generate a high-speed drive signal based on the input data and input the drive signal to the optical modulator 13A. The optical modulator 13A is configured to modulate light from the LD 40 with a drive signal to output an optical signal.

The frequency characteristic adjustment circuit 100A disposed between the drive circuit 11 and the optical modulator 13A includes a capacitor CF and multiple resistors RF (see FIGS. 7A and 7B) or resistor blocks B0 to $B_m$ (see FIG. 8). The resistance value of the characteristic adjustment circuit 100A is selected and changed by the control circuit 9 that controls the resistance block selected by the word lines $W_{tm}$ and $W_{tm}$(bar), and the potential (signal) applied to the selection signals $P_0$ to $P_n$, $N_0$ (bar) to $N_{n'}$ (bar), which may keep constant, regardless of the drive signal level, the amount of electric charge stored in the junction between the PN junction of the optical modulator 13A and the frequency characteristic adjustment circuit 100A.

This configuration may be enabled to obtain a stable light output, even when process variability is present, or even when the current/voltage characteristic or charge/voltage characteristic of the circuit to be driven is nonlinear.

The receiver of the optical signal converts the received optical signal into an electric signal, amplifies the converted electric signal to an appropriate level, and then inputs the amplified electric signal into the CDR 4. The CDR 4 identifies data from the received signal to reproduce the data and output the data signal to a digital signal processor.

The E/O converter 6 and the 0/E converter 7 may be formed in one chip by silicon photonics technology. The drive circuit 11, the frequency characteristic adjusting circuit 10, and the amplifier (AMP) 8 may be formed in one integrated (IC) chip. Since the temperature control of the optical transmitter 2 and the drive current control of the LD 40 are not directly related to the present invention, illustration of these control components is omitted from the specification.

By using the frequency characteristic adjusting circuit 100A of the embodiment, the operation band of the optical circuit element such as the optical modulator and the laser diode is expanded to enable the high speed driving, similar to the equalizer circuit of the related art configuration. The use of the frequency characteristic adjusting circuit 100A of the embodiment enables control of the resistance block to achieve a desired resistance value or a value close to the desired value so as to keep constant the amount of electric charge applied to the input terminal of the optical circuit element 13, regardless of the DC resistance ratio or the change of the input data between "0" and "1". Note that when high-speed driving is not required, the equalizer circuit 50 of FIGS. 7A and 7B may be used as a frequency characteristic circuit instead of the frequency characteristic adjusting circuit 100A of FIG. 10. Further, a selector circuit may be used instead of the switches SW1 and SW2 in FIGS. 7A and 7B. In this specification and the claims, the term "switch" also indicates a selector.

The above-described configuration enables the operation band of the optical circuit element to be expanded, thereby achieving stable frequency characteristics.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A frequency characteristic adjusting circuit disposed between an optical circuit element and a drive circuit driving the optical circuit element, the frequency characteristic adjusting circuit comprising:
    a capacitor; and
    two or more series circuits each having a resistor and a switch, the two or more series circuits being connected in parallel with the capacitor, wherein
    resistance of the frequency characteristic adjusting circuit is changed according to an output voltage of the drive circuit by changing an ON/OFF state of the switch of at least one of the series circuits such that electric charge at a contact point between the optical circuit element and the capacitor is adjusted to be constant regardless of the output voltage of the drive circuit.

2. The frequency characteristic adjusting circuit as claimed in claim 1, wherein
    the resistance of the frequency characteristic adjusting circuit is changed according to the output voltage of the drive circuit such that the electric charge at the contact point between the optical circuit element and the capacitor is adjusted to be constant regardless of the output voltage of the drive circuit even when there is nonlinearity in a voltage-dependency of capacitance of the optical circuit element.

3. The frequency characteristic adjusting circuit as claimed in claim 1, wherein for each series circuit,
    the switch includes a plurality of transistors connected in parallel,
    the resistor is a resistor element, and
    a combined resistance value of ON-resistance of the transistors and resistance of the resistor element changes according to the output voltage of the driving circuit by controlling the number of ON-state transistors or the number of OFF-state transistors.

4. The frequency characteristic adjusting circuit as claimed in claim 3, wherein
    a subset of the plurality of transistors is maintained in ON state.

5. The frequency characteristic adjusting circuit as claimed in claim 1, wherein an anode of the optical circuit element is connected to a first power supply, the drive circuit is connected to a second power supply, for each series circuit, the resistor is disposed on a cathode side of the optical circuit element, and the switch is disposed on an output side of the drive circuit, the switch includes a plurality of PMOS transistors and a plurality of NMOS transistors, and when the switch is selected, a logic is built such that gates of the PMOS transistors are biased to a low potential and gates of the NMOS transistors are biased to a high potential.

6. The frequency characteristic adjusting circuit as claimed in claim 5, wherein the high potential and a potential of the second power supply are the same.

7. The frequency characteristic adjusting circuit as claimed in claim 1, wherein a cathode of the optical circuit element is connected to a first power supply, the drive circuit is connected to a second power supply, for each series circuit, the resistor is disposed on an anode side of the optical circuit element, the switch is disposed on an output side of the drive circuit, the switch includes a plurality of PMOS transistors and a plurality of NMOS transistors, and when the switch is selected, a logic is built such that gates of the PMOS transistors are biased to a low potential and gates of the NMOS transistors are biased to a high potential.

8. The frequency characteristic adjusting circuit as claimed in claim 7, wherein the high potential and a potential of the second power supply are the same.

9. The frequency characteristic adjusting circuit as claimed in claim 1, wherein the two or more resistors have resistance values of $\frac{1}{2}^n$ (n is an integer of 0 or more) with respect to a reference resistance value.

10. An optical transmitter comprising:

an optical circuit element configured to output an optical signal based on an electric signal;

a drive circuit configured to drive the optical circuit element; and a frequency characteristic adjusting circuit disposed between the optical circuit element and the drive circuit, the frequency characteristic adjusting circuit including a capacitor, and two or more series circuits each having a resistor and a switch, the two or more series circuits being connected in parallel with the capacitor, wherein resistance of the frequency characteristic adjusting circuit is changed according to an output voltage of the drive circuit by changing an ON/OFF state of the switch of at least one of the series circuits such that electric charge at a contact point between the optical circuit element and the capacitor is adjusted to be constant regardless of the output voltage of the drive circuit.

11. An optical transceiver comprising:

an optical transmitter including an optical circuit element configured to output an optical signal based on an electric signal, a drive circuit configured to drive the optical circuit element, and a frequency characteristic adjusting circuit disposed between the optical circuit element and the drive circuit, wherein the frequency characteristic adjusting circuit includes a capacitor, and two or more series circuits each having a resistor and a switch, the two or more series circuits being connected in parallel with the capacitor, wherein resistance of the frequency characteristic adjusting circuit is changed according to an output voltage of the drive circuit by changing an ON/OFF state of the switch of at least one of the series circuits such that electric charge at a contact point between the optical circuit element and the capacitor is adjusted to be constant regardless of the output voltage of the drive circuit; and an optical receiver.

* * * * *